United States Patent
Endo et al.

(10) Patent No.: US 6,458,703 B2
(45) Date of Patent: *Oct. 1, 2002

(54) METHOD FOR MANUFACTURING SEMICONDUCTOR DEVICES WITH ALLEVRATION OF THERMAL STRESS GENERATION IN CONDUCTIVE COATING

(75) Inventors: Mamoru Endo, Sakata; Junichi Takeuchi, Chino; Michio Asahina, Sakata; Eiji Suzuki, Fujimi-machi; Kazuki Matsumoto, Chino, all of (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/389,515

(22) Filed: Sep. 3, 1999

(30) Foreign Application Priority Data

Sep. 4, 1998 (JP) ............................................ 10-251563
Dec. 28, 1998 (JP) ............................................ 10-374109

(51) Int. Cl.$^7$ .............................................. H01L 21/44
(52) U.S. Cl. ...................... 438/688; 438/622; 438/625; 438/632; 438/672
(58) Field of Search .................................. 438/688, 687, 438/622, 625, 627, 629, 642, 648, 675, 652, 653, 656, 666, 667, 668, 618, 632, 669, 672

(56) References Cited

U.S. PATENT DOCUMENTS

| | | | | |
|---|---|---|---|---|
| 5,200,030 A | * | 4/1993 | Cho et al. ................... | 437/194 |
| 5,288,665 A | * | 2/1994 | Nulman ...................... | 437/194 |
| 5,407,863 A | * | 4/1995 | Katsura et al. ............. | 437/197 |
| 5,918,149 A | | 6/1999 | Besser et al. ............... | 438/680 |
| 5,925,227 A | * | 7/1999 | Kobayashi et al. .... | 204/298.25 |
| 5,981,362 A | * | 11/1999 | Saito .......................... | 438/488 |
| 5,985,747 A | * | 11/1999 | Taguchi ...................... | 438/622 |
| 6,107,182 A | * | 8/2000 | Ashima et al. ............. | 438/618 |

FOREIGN PATENT DOCUMENTS

JP          08037185      *   2/1996

* cited by examiner

*Primary Examiner*—Tuan H. Nguyen
*Assistant Examiner*—T. Pham
(74) *Attorney, Agent, or Firm*—Hogan & Hartson, LLP

(57) ABSTRACT

A method for manufacturing a semiconductor device that fills contact holes with conductive material such as aluminum or an aluminum alloy. A semiconductor device is manufactured by the process of forming an opening such as a contact hole in an interlayer dielectric film formed on a semiconductor substrate having a device element formed thereon. A first film and a second film made of conductive material such as aluminum or an alloy containing aluminum are formed on the interlayer dielectric film and the opening. The second film is then gradually cooled.

22 Claims, 8 Drawing Sheets

METHOD FOR MANUFACTURING SEMICONDUCTOR DEVICES WITH ALLEVRATION OF THERMAL STRESS GENERATION IN CONDUCTIVE COATING

BACKGROUND OF THE INVENTION

1. Area of the Art

The present invention relates to a semiconductor device and a method for manufacturing thereof, and more particularly, to a semiconductor device that is capable of miniaturizing devices and has a contact structure using wiring material such as aluminum, and a method for manufacturing the semiconductor device.

2. Description of the Related Art

Semiconductors, such as LSIs, require openings such as contact holes of a greater aspect ratio for higher element miniaturization, higher density integration and increased multiple layers. Many have tried to use aluminum and aluminum alloys that are useful wiring material to fill in contact holes. However, it is difficult to fill such contact holes with wiring material, and therefore it has been an important technical object to overcome, in recent years.

SUMMARY OF THE INVENTION

It is an object of an embodiment of the present invention to provide a method for manufacturing a semiconductor device that fills contact holes with conductive material such as aluminum or an aluminum alloy, such that the generation of whiskers in the surface of the conductive material is prevented.

In one or more embodiments of the invention, a semiconductor device is manufactured by the process of forming an opening such as a contact hole in an interlayer dielectric film formed on a semiconductor substrate having a device element. A film formed from conductive material such as aluminum or an alloy having aluminum as a main component is formed on the interlayer dielectric film and the opening. The film is then gradually cooled.

In one or more embodiments of the invention, a semiconductor device is manufactured by the process of forming an opening such as a contact hole in an interlayer dielectric film formed on a semiconductor substrate having an element. A first film formed from conductive material such as aluminum or an alloy having aluminum as a main component is formed on the interlayer dielectric film and the opening at relatively low temperatures. A second film formed from conductive material such as aluminum or an alloy having aluminum as a main component is formed on the first film at temperatures higher than the film formation temperature for forming the first film. The second film is then gradually cooled.

A method for manufacturing a semiconductor device in accordance with one or more embodiments of the invention comprises the steps of forming an opening such as a contact hole in an interlayer dielectric film formed on a semiconductor substrate having an element, forming a conductive coating film preferably formed from aluminum or an alloy having aluminum as a main component on the interlayer dielectric film and the opening, and gradually cooling the coating film.

In one or more embodiments of the invention, when the coating film is gradually cooled, thermal stresses generated in the film are alleviated, and generation of whiskers in the surface of the film is prevented. In one or more embodiments, the coating film may include multiple layers.

For example, a first coating film acting as an intermediate layer made of conductive material such as aluminum or an aluminum alloy may be formed at lower temperatures over the interlayer dielectric film first (e.g., temperatures of 200° C. or lower, and more preferably about 30—about 100° C.). Further, a second film acting as another coating layer made of conductive material such as aluminum or an aluminum alloy may be formed over the first film at higher temperatures (e.g. temperatures of 300° C. or higher and more preferably about 350—about 450° C.).

Formation of a first coating layer over the intermediate layer under the above-described temperature conditions suppresses the gasification of gas components contained in the interlayer dielectric film and the intermediate layer, and prevents the intermediate layer from lowering its wettability that may be caused by gases discharged outside from the intermediate layer. As a result, the first coating layer can be optimally adhered to the intermediate layer, and therefore film formation is conducted with good step coverage.

The presence of the first coating film suppresses generation of gases from the interlayer dielectric film and the intermediate layer which are provided below the first coating film, even when the temperature of the substrate rises. As a result, the second coating film can be formed, at relatively high temperatures (e.g., 300° or higher) in which aluminum alloys can flow and diffuse. As a result, openings such as contact holes formed in the interlayer dielectric film can be filled in with good step coverage and without generating voids. In one or more embodiments of the invention, the stated manufacturing method is successfully applicable to very fine contact holes (e.g., holes of 0.2 μm diameter).

Further, in one or more embodiments of the invention, the coating films are formed by a sputtering method. In a preferred embodiment, the coating films are formed continuously in the same chamber. When the coating films are successively formed in the same chamber, the temperature of the substrate and the chamber atmosphere are readily and accurately controlled so that inconveniences such as formation of an oxide layer on the first coating film are avoided.

In one or more embodiments of the invention, any gasification component contained in the interlayer dielectric film is removed by performing heat treatment at substrate temperatures (e.g., 300° C. to 550° C.) preferably under reduced pressure. The removal of gasification components (degasification) may preferably be conducted after the formation of the opening in the interlayer dielectric film. In the present invention, the term "gasification components" refers to gas components (e.g., water, hydrogen, oxygen or nitrogen) generated from deposited layers, such as the interlayer dielectric films and the intermediate layers under reduced pressure and at substrate temperatures. By performing the degasification, generation gases that may be contained in the interlayer dielectric film are suppressed during the formation of the second coating film at relatively high temperatures. Accordingly, by removing gasifying components contained in the interlayer dielectric film, the intermediate layers are securely prevented from lowering their wettability and from developing voids that may be caused by the presence of such gases between the intermediate layers and the coating film that covers those layers.

In one or more embodiments of the invention, gases discharged from the interlayer dielectric film are absorbed by the intermediate layers, but not the coating layers in the contact holes. As a result, contact sections coated with low resistance conductive films with good coverage are formed in the contact holes.

In one or more embodiments of the invention, the substrate temperature is lowered before the intermediate coating film is formed. In some embodiments the forming of the coating film and the cooling of the substrate are continuously performed in the same apparatus having a plurality of chambers that are maintained under a reduced pressure state. This structure reduces the number of steps for transporting and mounting wafers. Accordingly, the process is simplified and pollution of substrates is prevented.

In one or more embodiments of the invention, after gradually cooling the coated films (i.e., the intermediate film and the coating layer formed over the intermediate film), a third film is formed on the above-described films at temperatures ranging from about the normal temperature to about 100° C. The formation of the third film, in one or more embodiments, is conducted by a sputtering method. In other embodiments, the gradual cooling of the coating films and forming said third film is continuously performed in the same chamber. This structure reduces the number of steps for transporting and mounting wafers. Accordingly, the process is simplified and pollution of substrates is prevented.

Other features and advantages of the invention will be apparent from the following detailed description, taken in conjunction with the accompanying drawings which illustrate, by way of example, various features of embodiments of the invention.

DETAILED DESCRIPTION OF PREFERRED EMBODIMENTS

Preferred embodiments of the present invention will be described below with reference to the accompanying drawings.

Figure 1A:
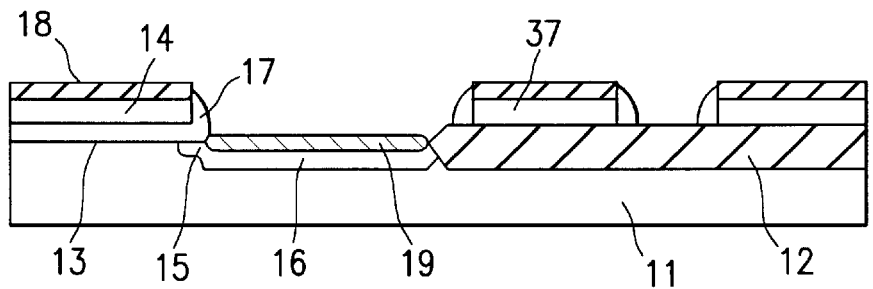
FIGS. 1(a), 1(b) and 1(c) are cross-sectional views of a semiconductor device that is used to illustrate a method for manufacturing the semiconductor device in the order of manufacturing steps.
Figure 1B:
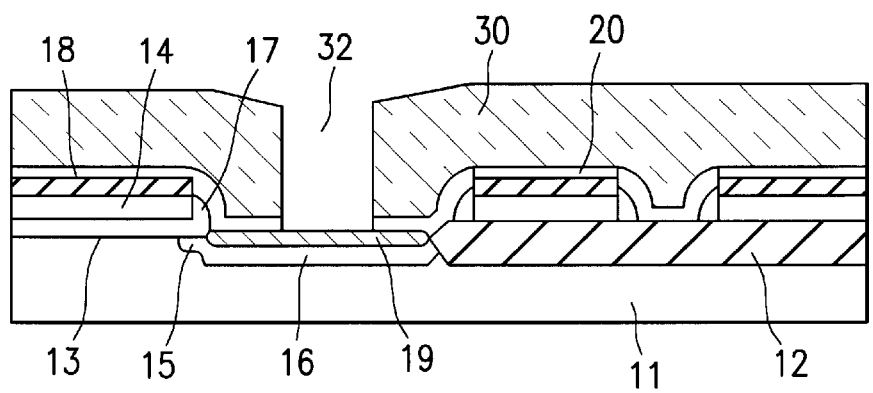
Figure 1C:
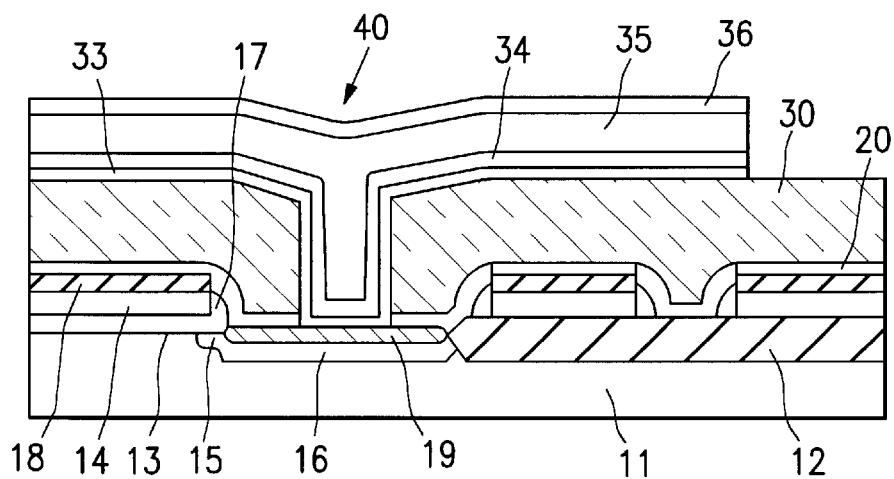

FIGS. 1(a)–1(c) are schematic cross-sectional views illustrating a semiconductor device and a method for manufacturing a semiconductor device in accordance with one or more embodiments of the invention. With reference to FIG. 1(a), one or more embodiments of the invention comprise silicon substrate 11, field insulation film 12, gate oxide film 13, gate electrode 14, low impurity concentration layer 15, high impurity concentration layer 16, sidewall spacer 17, silicon oxide film 18, titanium silicide layer 19, and wiring layer 37.

In one or more embodiments of the invention, a metal-oxide semiconductor (MOS) element is formed on silicon substrate 11 by a commonly practiced method. For example, field insulation film 12 is formed on silicon substrate 11 by selective oxidation, and gate oxide film 13 is formed in an active region. Then, a threshold voltage level is adjusted by channel injection, and tungsten silicide is sputtered on a polysilicon film that is grown by pyrolyzing monosilane ($SiH_4$) subjected to thermal decomposition. Silicon oxide film 18 is deposited and etched to a specified pattern to form gate electrode 14. Wiring layer 37 consisting of a polysilicon film and a tungsten silicide film may be formed on field insulation film 12, if required.

Phosphorous is ion-implanted to form low concentration impurity layer 15 for a source region or a drain region. Side wall spacer 17 of a silicon oxide film is formed on a side of gate electrode 14. Then arsenic is ion-implanted, and the impurity is activated by an anneal treatment using a halogen lamp to thereby form high impurity concentration layer 16 for the source region or the drain region.

Next, a silicon oxide film is grown in the vapor phase to a thickness of 100 nm or less, for example. The silicon oxide film is selectively etched by a mixed solution of HF and $NH_4F$, for example, to expose designated regions of the silicon substrate. In one or more embodiments of the invention, titanium is sputtered to a film thickness of 30–100 nm, for example, and is rapidly annealed for about several seconds to 60 seconds at temperatures of about 650–750° C. in a nitrogen atmosphere in which oxygen content is controlled to 50 ppm or less. As a result, a layer of titanium monosilicide is formed on the exposed surface of the silicon substrate, and a layer of titanium nitride (TiN) that is rich in titanium is formed on silicon oxide film 18.

When immersed in an etching solution (e.g., a mixed solution of $NH_4OH$ and $H_2O_2$), the titanium nitride (TiN) layer is etched, and the titanium monosilicide layer remains only on the surface of the silicon substrate. Further, lamp anneal is performed at temperatures of about 750–850° C. to change monosilicide of the monosilicide layer to disilicide, so that titanium silicide layer 19 is formed on the high concentration impurity layer 16 in a self-alignment manner. In one or more embodiments of the invention, gate electrode 14 is formed with polysilicon and exposed by a selective etching, wherein gate electrode 14 and source/drain regions are separated from one another by a side wall spacer (i.e., a titanium salicide structure).

With reference to FIG. 1(b), in one or more embodiments of the invention, silicon oxide film 20 (having a film thickness of 100–200 nm, for example) that serves in part as an interlayer dielectric film, is formed by the plasma reaction between tetraethylorthosilicate (TEOS) and oxygen. Silicon oxide film 20 does not cause oxidation or cusping of titanium silicide layer 19 and has greater insulation, slower etching speed against a hydrogen fluoride solution, and a higher density than a layer that is grown from $SiH_4$.

In one or more embodiments, a silicon oxide film is directly formed on titanium silicide layer 19. To avoid cracks and peeling that may result, due to high temperatures, the process temperature is lowered (to 600° C. or lower temperatures, for example). After the silicon oxide film is formed on titanium silicide layer 19 (e.g., to a film thickness of about 100 nm) at a relatively low temperature, the temperature can be raised to a substantially high temperature. For example, the temperature can be raised to about 900° C. if an anneal process and a vapor phase oxidation process that expose the layers are conducted in an oxidizing atmosphere, preferably one other than water vapor.

Boron-doped phosphosilicate glass (BPSG) film 30 (preferably having a film thickness of about several hundreds nm to 1 $\mu$m) is formed on silicon oxide film 20 as an interlayer dielectric film by vapor phase reaction of $SiH_4$, or a silane compound such as TEOS with oxygen, ozone and gases including phosphorous and boron. Anneal is then performed in a nitrogen atmosphere, at preferred temperatures of 800–900° C., to conduct a high temperature flow planarization. Instead of the high temperature flow of BPSG film 30, chemical-mechanical polishing (CMP) may be performed or a commonly used SOG layer can be used to conduct planarization.

Next, BPSG film 30 that forms the interlayer dielectric film and silicon oxide film 20 are selectively and anisotropically etched by a reactive ion etcher containing $CHF_3$ and $CF_4$ as main gases, to form contact hole 32 having a preferred diameter of 0.2–0.5 $\mu$m. In one or more embodiments of the invention, lamp heating (heat treatment A) is conducted in a lamp chamber under base pressures of, for example, $1\times10^{-4}$ Pa or lower, preferably at temperatures of 150–200° C. for 30–60 seconds. Then, in a different chamber where argon gas is introduced at pressures (e.g., 0.1–1.0 Pa), heat treatment (degasification step: heat treatment B) is conducted at higher temperatures (e.g., 300–550° C.) for 30–120 seconds to perform the degasification process.

In one or more embodiments, the entire wafer including its rear surface and side surface is heat treated (during heat treatment A) to remove water content that adheres to the wafer. Then, (during heat treatment B) gasification components (oxygen, hydrogen, water and nitrogen) in BPSG film 30 are removed. As a result, generation of gasification components from BPSG file 30 can be prevented during film formation steps later performed.

With reference to FIG. 1(c), barrier layer 33 is formed from a multiple-layered film composed of a barrier film having a barrier function and a conductive film. The conductive film is formed between barrier layer 33 that has a high resistance and an impurity diffusion layer formed in the silicon substrate, namely, the source region or the drain region to increase conductivity between barrier layer 33 and the impurity diffusion layer. For barrier layer 33, a commonly used material, such as, for example, nitride of titanium or cobalt, may be used. For the conductive film, a high-melting-point metal, such as, for example, titanium and cobalt, may be used. Titanium and cobalt react with silicon that forms the substrate and become silicide.

Barrier layer 33 (e.g., a titanium nitride (TiN) film or a titanium (Ti) film) contains gasification components (oxygen, hydrogen, water, nitrogen) of several tens atom % in solid solution. Accordingly, gasification components in BPSG film 30 of the interlayer dielectric film are removed before forming these films in order to successfully form a conductive coating layer in the contact hole. The removal of gasification elements from BPSG film 30 below barrier layer 33 prevents the possibility that the gasification components in BPSG film are discharged and enter barrier layer 33 at a formation temperature (e.g., 300° C. or higher) for forming barrier layer. This will further prevent the gases that may be discharged from barrier layer 33 when a conductive film is formed from coming out into a boundary between barrier layer 33 and the conductive film, causing deteriorating effects on cohesiveness and fluidity of the aluminum layer.

In one or more embodiments of the invention, a titanium film, preferably having a thickness of 20–70 nm, is formed by a sputtering method. The titanium film serves as a conductive film that forms barrier layer 33. Then, a titanium nitride (TiN) film is formed (e.g. to a film thickness of 30–150 nm) as a barrier layer in another chamber. Sputtering is conducted in a sputtering temperature range of preferably 200–450° C. depending on the film thickness. Then, the layers are exposed to oxygen plasma under pressure (e.g., pressures of 10–100 Pa) for several seconds, and more preferably for 10–100 seconds, and annealed in a nitride or hydrogen atmosphere at temperatures of 450–700° C. for several minutes, and more preferably for 10–60 minuets. As a result, titanium oxides in the form of islands are formed in barrier layer 33. This treatment increases the barrier capability of barrier layer 33. Also, an anneal treatment can be conducted by heat treatment at temperatures of 400–800° C. in a lamp anneal furnace with oxygen of at least several hundreds ppm—several % contained in the lamp anneal furnace.

After barrier layer 33 is formed, a wetting layer (e.g., a titanium layer) is formed before a cooling process that is performed to cool the wafer as further described below. Before cooling the wafer (substrate), a heat treatment (heat treatment C) is conducted in a lamp chamber, preferably at temperatures of 150–250° C. for 30–60 seconds under base pressures of $1\times10^{-4}$ Pa or lower to remove substances such as water adhered to the substrate. In one or more embodiments of the invention, before a coating film is formed, the substrate temperature is lowered (e.g., to 100° C. or lower, and more preferably to the normal temperature −50° C.). This cooling lowers the temperature of the substrate which has been heated up through the heat treatment C. Thus, the amount of gases that may be discharged from BPSG film 30, barrier layer 33 and the entire surface of the wafer at the time of film formation of coating layer is reduced to a minimum. As a result, harmful effects of gases that may adhere to boundary areas between barrier layer 33 and coating layer 34 and damage their coverage and cohesion are prevented.

The above-described cooling step may preferably be performed using a sputter apparatus that has a plurality of chambers. In one embodiment, each of the chambers has a structure similar to the chamber for forming aluminum films. For example, the sputter apparatus may have stage 52 equipped with a cooling capability in the chamber, and a substrate may be placed on stage 52 to reduce the substrate temperature to a designated temperature.

Figure 2A:
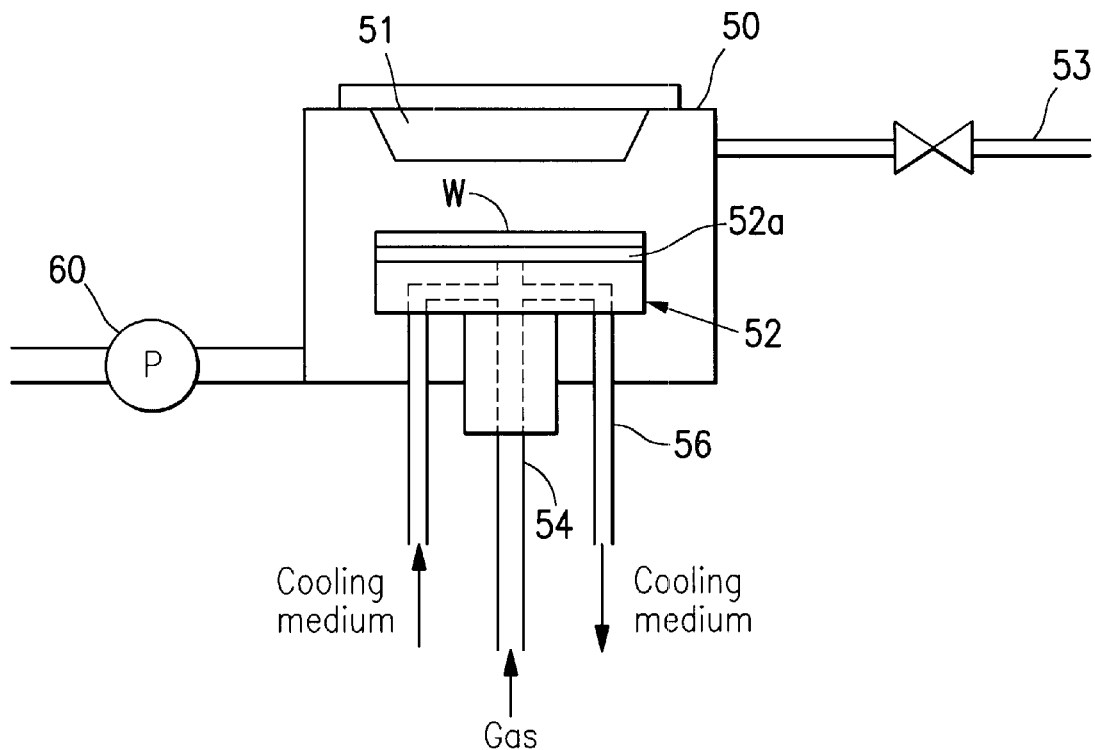
FIG. 2(a) schematically shows an example of a sputter apparatus used in one embodiment of the present invention.
Figure 2B:
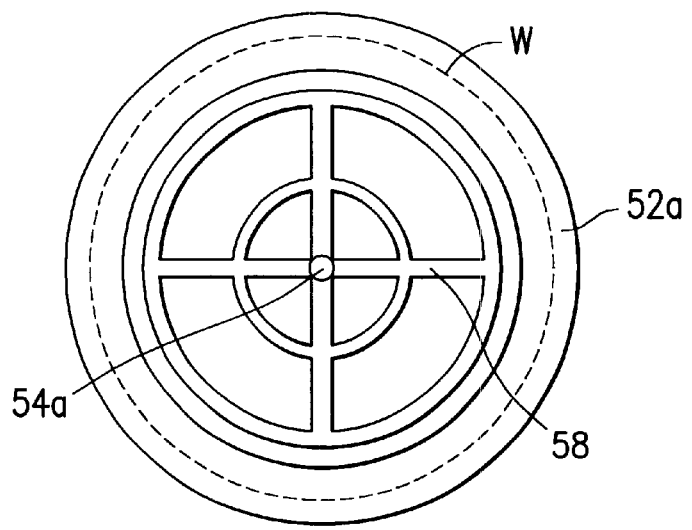
FIG. 2(b) is a plan view of stage 52 in accordance with one or more embodiments of the invention.

FIG. 2(a) schematically shows a chamber including stage 52 that is equipped with a cooling function, and FIG. 2(b) is a plan view of stage 52, in one or more embodiments of the invention. The sputter apparatus has a plurality of chambers 50, each having substantially the same structure. Chamber 50 contains a target 51 functioning also as an electrode and electrode 52 functioning also as a stage (the terms "electrode 52" and "stage 52" are interchangeable and are used as such within the body of this application). Electrode 52 is structured to mount a substrate (wafer) W to be cooled. Chamber 50 is provided with exhaust system 60 that maintains the interior of chamber 50 in a vacuum state, and a first gas supply channel 53 for supplying gases to chamber 50. Electrode 52 defines a top surface and protruded support section 52a provided on the top surface along its periphery as shown in FIG. 2 (b).

Protruded support section 52a provides a space between electrode 52 and substrate W when substrate W is placed on electrode 52. Further, second gas supply channel 54 is connected to electrode 52. A heat conductive medium, such as, for example, argon gas, is supplied in the space between electrode 52 and substrate W through second gas supply channel 54. Electrode 52 also serves as a cooling system to cool substrate W. Electrode 52 is controlled to have a constant temperature by a coolant that is supplied through a coolant supply channel 56, for example, by a circular flow of water. The top surface of electrode 52 has grooves 58 formed in a specified pattern, for example, as shown in FIG. 2(b), to uniformly supply gases in the space. Gas discharge port 54a, communicating with second gas supply channel 54, is provided at an intersection of the grooves.

In one or more embodiments of the invention, chamber 50 is operated to cool substrate W. The interior of chamber 50 is placed in a reduced pressure state (e.g., $6 \times 10^{-6}$ Pa or lower) by exhaust system 60. Substrate W is mounted on support section 52a of electrode 52. Substrate W is then cooled while a gas that serves as a heat conductive medium is supplied in the space between electrode 52 and substrate W through second gas supply channel 54. The pressure of the space is maintained preferably at 600–1000 Pa, and gases that leak from the space into the chamber are exhausted by exhaust system 60.

The space between electrode 52 and substrate W is placed under pressure to cool substrate W. In one or more embodiments of the invention, the thermal conductance between electrode 52 and substrate W is increased in order to increase the cooling efficiency for cooling substrate W. This is achieved by increasing the pressure of the gas (heat conductive medium) in the space between electrode 52 and substrate W.

To cool substrate W, it is placed in a vacuum chamber and mounted on stage 52 equipped with a cooling system within the chamber. According to one cooling method, gas is not directly supplied to a space between stage 52 and the substrate. Instead, the pressure of the chamber is increased in order to increase the pressure in the space between stage 52 and the substrate.

In accordance with one or more embodiments of the invention, a gas is flown in a space between the rear surface of the wafer and electrode 52, to thereby secure a required pressure for the space between electrode 52 and substrate W. This allows the pressure of the space to be controlled independent of the pressure of the chamber. For maintaining the thermal conduction medium between the substrate and stage 52, the pressure of the chamber is controlled independently from the pressure of the space and for example is maintained at $1 \times 10^{-3}$–0.1 Pa. This process securely prevents pollution of the upper surface of the substrate by the gas molecules. As a result, the reflowability of coating material is improved and its resistance is lowered. Moreover, the pressure of the space can be set in a specific range (e.g., 600–1300 Pa) without increasing the pressure of the chamber. The thermal conductance and therefore the cooling efficiency are improved.

Referring to FIG. 1(c), in one or more embodiments of the invention, first coating layer 34 is formed by sputtering an aluminum-copper alloy (e.g., aluminum containing 0.2–1.0 wt % of copper) at a high speed, preferably at temperatures of 200° C. or lower and more preferably at 30–100° C., to a film thickness of preferably 150–300 nm. Then, the substrate temperature is raised (e.g., to 350–460° C.) in the same chamber, and aluminum similarly containing copper is sputtered at a low speed to form second coating film 35, preferably having a thickness of 300–600 nm. The "sputtering speed" may vary depending on the film forming condition and design specifications. In one or more embodiments of the invention, the terms "high speed" refer to sputtering speeds of about 10 nm/second or faster, and the terms "low speed" refer to sputtering speeds of about 3 nm/second or slower.

In one embodiment, sputtering is performed in a different chamber of the sputter apparatus, other than the one that is used when the wafer is cooled. In this manner, the cooling process and the film forming process are conducted in the same apparatus that is controlled to have a reduced pressure condition. As a result, the number of steps required for moving and mounting substrates is reduced, and therefore the process is simplified and pollution of the substrate is prevented.

Figure 3:
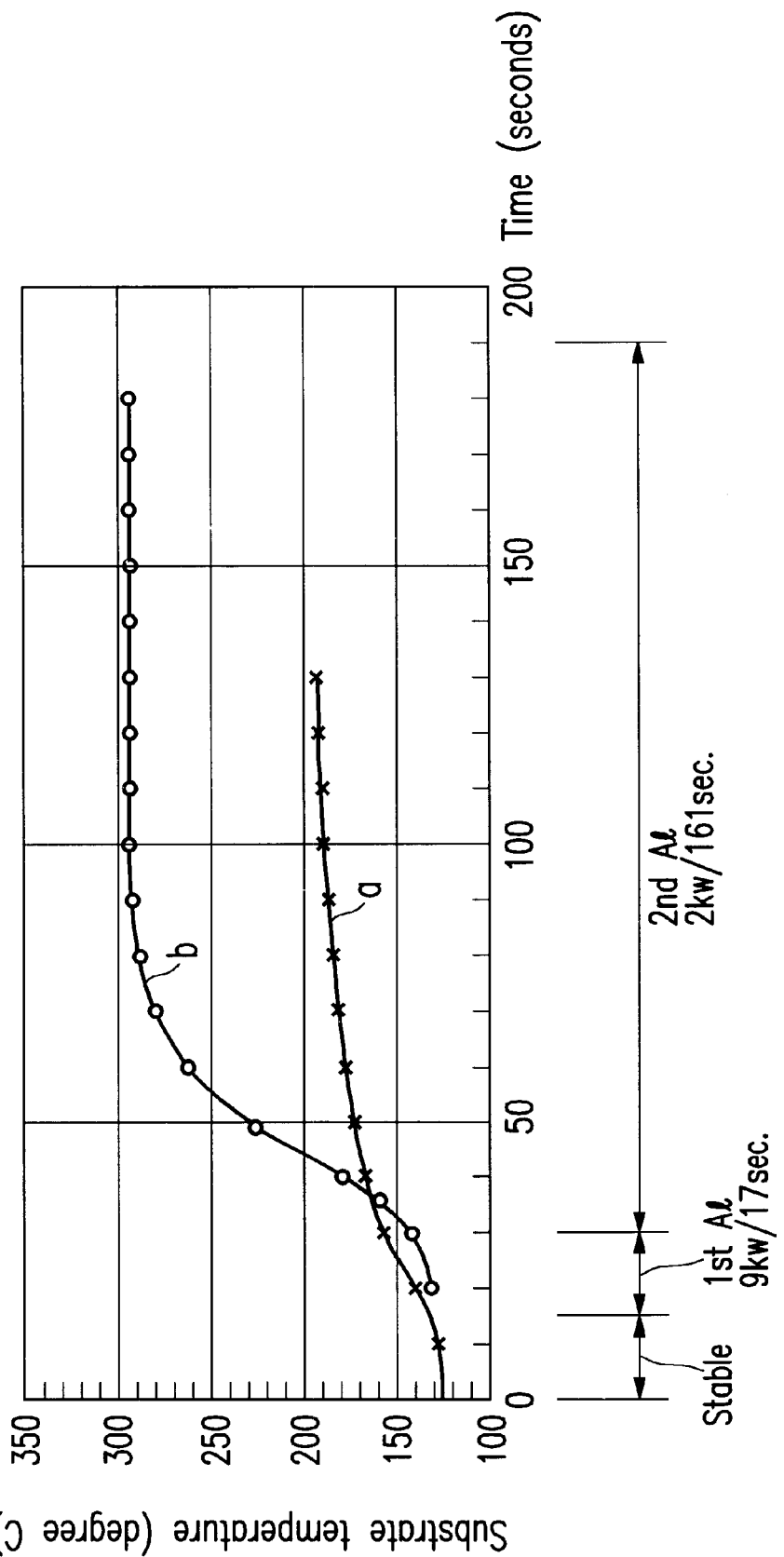
FIG. 3 shows relations between times and substrate temperatures when the substrate temperature is controlled by using the sputter apparatus shown in FIG. 2, in accordance with one or more embodiments of the invention.

In one or more embodiments of the invention, both first gas supply channel 53 and second gas supply channel 54 supply argon gas. The temperature of substrate (wafer) W is controlled by the gas supplied through second gas supply channel 54. One example of controlling the substrate temperature by the sputter apparatus is illustrated in FIG. 3. In FIG. 3, the axis of abscissa represents the time elapsed and the axis of ordinate represents the substrate (wafer) temperature. The line marked as "a" indicates changes in the substrate temperature when stage 52 of the sputter apparatus is set at 350° C., for example. The line marked as "b" indicates changes in the substrate temperature when the temperature of stage 52 is increased by supplying argon gas through second gas supply channel 54 into the chamber.

In one or more embodiments of the invention, stage 52 is pre-heated and its temperature is set at a film forming temperature for forming a conductive coating film (e.g., at 350–500° C.). When the intermediate film layer is formed, the substrate temperature is gradually increased by heating stage 52 without gas supply from second gas supply channel 54, as indicated by line "a" shown in FIG. 3. When the conductive coating film layer is formed, the substrate temperature is controlled to rapidly rise by supplying heated gas through second gas supply channel 54, and is later stabilized at a predetermined temperature level, as indicated by line "b" shown in FIG. 3.

In the example shown in FIG. 3, the temperature of stage 52 is set at 350° C., and first coating film 34 is formed while the substrate temperature is set at 125–150° C., and immediately thereafter, the film formation of second coating film 35 is performed. Referring to FIG. 1(c), in the process of forming a coating layer, first coating film 34 is formed with high power, and second coating film 35 is formed with a lower power, depending on the film forming speed. In embodiments of the invention, the power is not reduced to zero when the power is switched from high to low power. This prevents the formation of an oxide film on the surface of the first coating film and the lowering of the wettability of the second coating film with respect to the first coating film, and the deterioration of cohesion between the films. By continuously applying power, coating material is continuously supplied onto the surface of the film during the film formation, and formation of an oxide film is restricted. In this example, the level of power is preferably set at 5–10 kw for high power and at 300 W–1 kW for low power, under the temperature condition shown in FIG. 3. The power may vary depending on conditions of the sputter apparatus and film forming conditions. Specific ranges stated here are only for the purpose of example and should not be construed as absolute measures.

In one or more embodiments of the invention, first coating film 34 and second coating film 35 are successively formed in the same chamber, under controlled temperature and power. This results in formation of stable coating films at relatively lower temperatures. The thickness of first coating film 34 is selected to be in an appropriate range in consideration of the capability of forming successive layers with good step coverage and the capability of controlling discharge of gasification components from barrier layer 33 and BPSG film 30 that form the interlayer dielectric film below first film 34. For example, the thickness may preferably be between 200–400 nm. The thickness of second film 35 is determined by the size of the contact hole and its aspect ratio. For example, the thickness of 300–1,000 nm is necessary to cover a contact hole smaller than 0.5 $\mu$m in diameter with aspect ratio of about 3.

In one or more embodiments of the invention, the substrate is transferred to a different chamber, and the substrate is gradually cooled at a low cooling speed in an argon atmosphere while the material that forms second film 35 is not solidified. When the substrate is slowly cooled after second film 35 is formed, thermal stresses generated in the surface of second film 35 are alleviated and generation of whiskers is restricted. When the substrate is cooled after second film 35 is formed, whiskers do not occur on the surface of second film 35. The above-described cooling step may preferably be conducted using a sputter apparatus that has a plurality of chambers, each having the same structure as that of chamber 50 used for formation of coating films 34 and 35.

In one or more embodiments of the invention, a third coating film is formed after first film 34 and second film 35 are formed and after the second cooling is performed. For example, the third film may be formed by a film forming method in which the film is formed at a high film forming speed by sputtering aluminum-copper alloy (e.g., aluminum containing 0.2–1.0 wt % of copper), at normal temperature (e.g., 100° C.). The third film formed by the method described above will have a smooth surface. As a result, this method provides good margins for focusing in photolithography. The thickness of the third film may preferably be, for example, 0–300 nm.

Sputtering is performed in the same chamber of the sputter apparatus that is used for the second wafer-cooling step. In this manner, the cooling process and the film forming process are conducted in the same apparatus and in the same chamber. As a result, the number of steps required for moving and mounting substrates is reduced, and therefore the process is simplified and pollution of the substrate is prevented. Typically, when the second cooling step is performed in the film forming process, whiskers are not generated on the surface of the conductive film. However, in one or more embodiments of the invention, a scrubber treatment to the surface of the film is performed to remove any whiskers that may have been generated on the surface of the film. In one example of such scrubber treatment, the surface of the film is brushed, and super-pure water is jetted, while being vibrated by ultrasonic sound, against the surface of the film to thereby remove foreign substances from the surface of the conductive film.

Referring to FIG. 1(c), in one or more embodiments of the invention, antireflection film 36 with a preferred film thickness of 30–80 nm is formed by sputter-depositing TiN in another sputter chamber. Metal wiring layer 40 is patterned by selectively etching a laminated layer of barrier layer 33, first film 34, second film 35 and antireflection film 36, using anisotropic dry etcher containing $Cl_2$ and $BCl_3$ gas, for example. In one or more embodiments of the invention, in metal wiring layer 40, a contact hole with an aspect ratio of preferably 0.5–3 and a diameter of 0.2–0.8 $\mu$m is filled with conductive material with good step coverage without creating voids.

Figure 4:
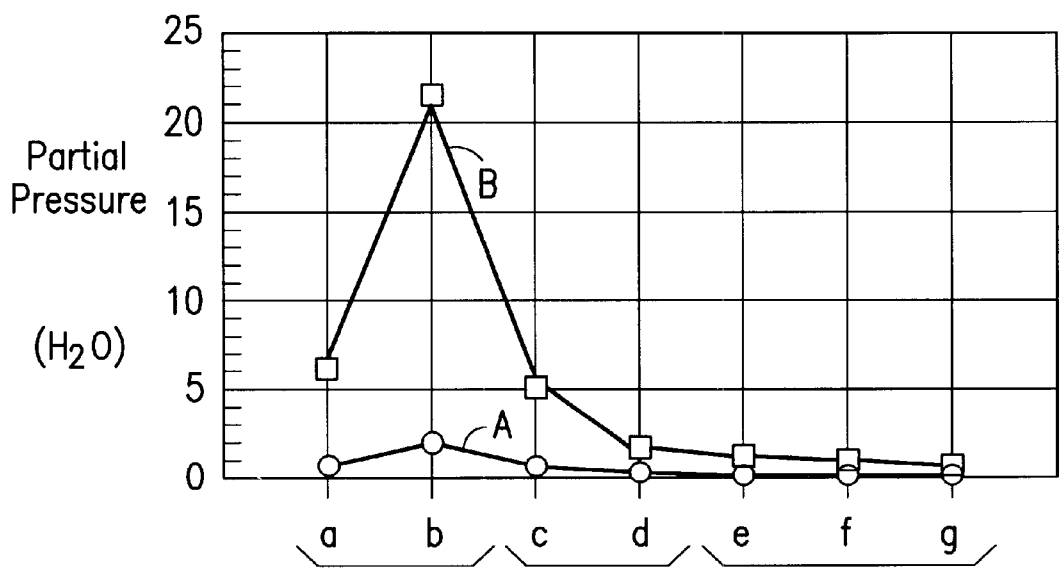
FIG. 4 shows relations between process timings and partial pressures of residual gas (water) within a chamber in a method for manufacturing a semiconductor device in accordance with one or more embodiments of the invention.
Figure 5:
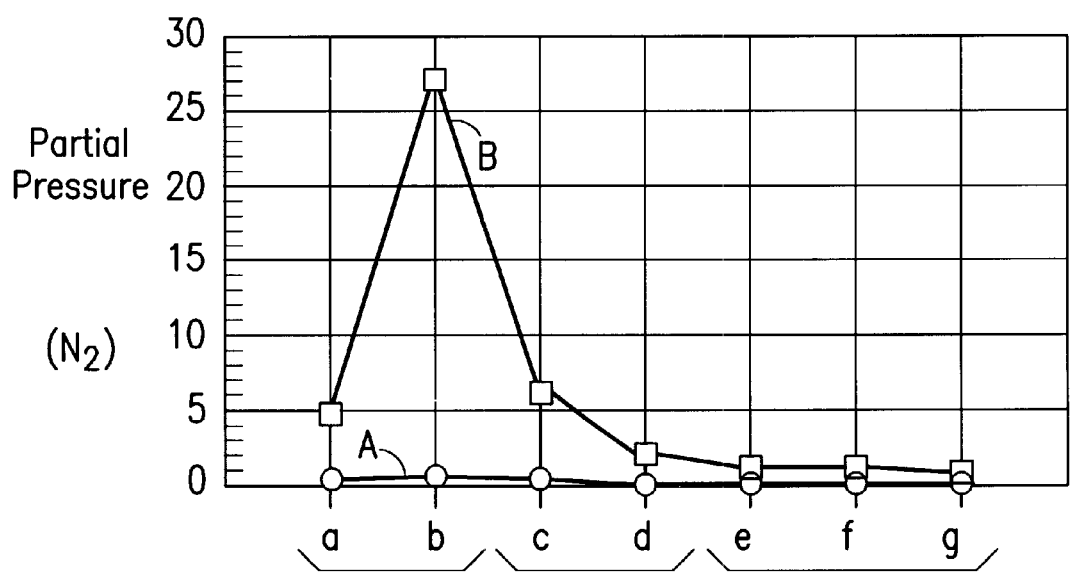
FIG. 5 shows relations between process timings and partial pressures of residual gas (nitrogen) within a chamber in a method for manufacturing a semiconductor device, in accordance with one or more embodiments of the invention.

FIGS. 4 and 5 show results of experiments that are conducted to investigate differences in the amount (partial pressure) of gases discharged from wafers, caused whether the degasification process is provided or not. In FIGS. 4 and 5, the axis of abscissa represents timings at which degasification processes are performed during the period between the heat treatment (heat treatment C) that is performed before film formation of a first aluminum film and the time after the film formation of a second aluminum film. The axis of ordinate represents partial pressures of residual gases within the chamber. Lines marked as "A" in FIGS. 4 and 5 represent cases where a degasification process is performed after forming the interlayer dielectric film. Lines marked as "B" in FIGS. 4 and 5 represent cases where a degasification process is not performed after forming the interlayer dielectric film.

In these experiments, the degasification process is performed at a pressure of 0.27 Pa and at 460° C. for 120 seconds. In each of the figures, marks "a" and "b" shown along the axis of abscissa indicate timings of the heat treatment C (in the first chamber) that is conducted before the film formation of the aluminum films. Mark "a" indicates the timing immediately after the wafer is placed in the first chamber, and mark "b" indicates the timing when the wafer is heated by lamp heating at 250° C. for 60 seconds. In this experiment, the pressure within the first chamber is set at $2.7 \times 10^{-6}$ Pa.

Marks "c" and "d" represent timings of the cooling step (in the second chamber). Mark "c" indicates the timing immediately after the wafer is placed in the second chamber, and mark "d" indicates the timing when the wafer is cooled to 20° C. The pressure within the second chamber is set at 0.27 Pa. When partial pressures are measured, the pressure within the chamber is reduced to $2.7 \times 10^{-6}$ Pa.

Marks "e", "f" and "g" represent timings of the film formation of the aluminum film (in the third chamber). Mark "e" indicates the timing immediately after the wafer is placed in the third chamber, mark "f" indicates the timing immediately after the first aluminum film is formed, and mark "g" indicates the timing immediately after the second aluminum film is formed. The pressure within the third chamber is set at 0.27 Pa. When partial pressures are measured, the pressure within the chamber is reduced to $2.7 \times 10^{-6}$ Pa.

When the degasification process is performed during the period between after film formation of the interlayer dielectric film and before film formation of barrier layer 33, it is confirmed based on FIGS. 4 and 5 that water and nitrogen are rarely discharged during the heat treatment and film formation of the aluminum films that are conducted later. In contrast, when the degasification process is not performed, both water and nitrogen are discharged in large amounts in the heat treatment that is conducted later, particularly, at the time of the heat treatment C indicated by mark "b".

Figure 8A:
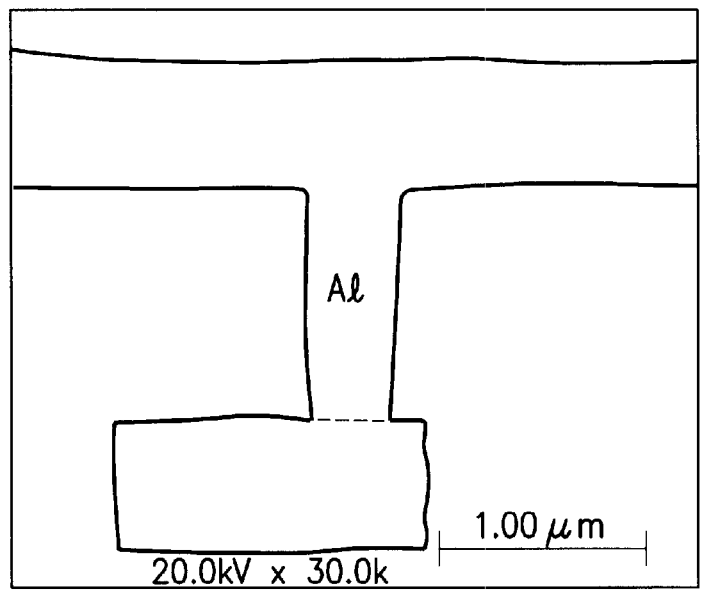
FIG. 8(a) is a cross-sectional view of a wafer that is illustrated, based on an electron microscopic photograph, wherein conductive films are formed after the wafer is cooled.
Figure 8B:
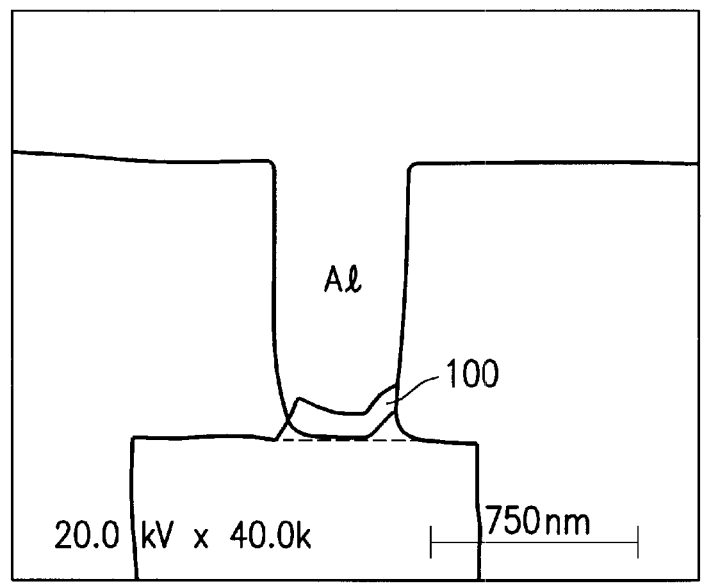
FIG. 8(b) is a view of a wafer that is illustrated, based on an electron microscopic photograph, wherein conductive films are formed without cooling the wafer.

FIG. 8(a) is a cross-sectional view of a wafer that is illustrated, based on an electron microscopic photograph, where a coating layer is formed after the wafer is cooled from 120° C. (that is the temperature of the heat treatment C) to 20° C. FIG. 8(b) is a cross-sectional view of a wafer that is illustrated, based on an electron microscopic photograph, where the coating layer is formed without cooling the wafer at the temperature of the heat treatment C, i.e., at 120° C. Two substrates are compared with each other. For one of the substrates, coating films are formed with cooling the wafer. For another, coating films are formed without cooling the wafer. When the cooling is performed, filling of the first and second coating films (Al) in a contact hole is excellent, as shown in FIG. 8(a). In contrast, when the cooling is not performed, the films do not completely fill bottom portions of contact holes. It is observed that about 30% of all contact holes in the wafer develop voids 100 as shown in FIG. 8(b).

Figure 6:
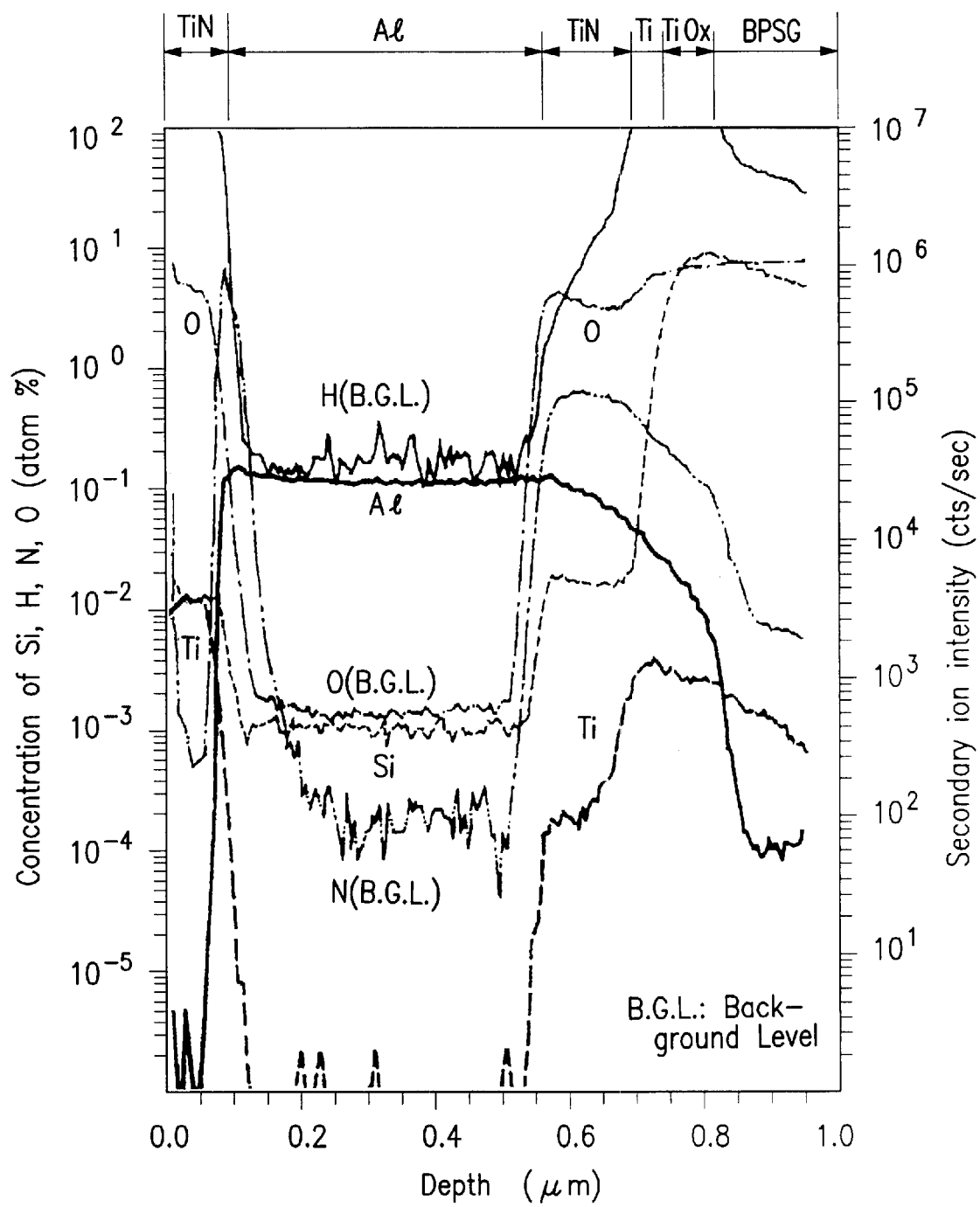
FIG. 6 shows data obtained by a SIMS for a laminated structure which does not have a wetting layer.
Figure 7:
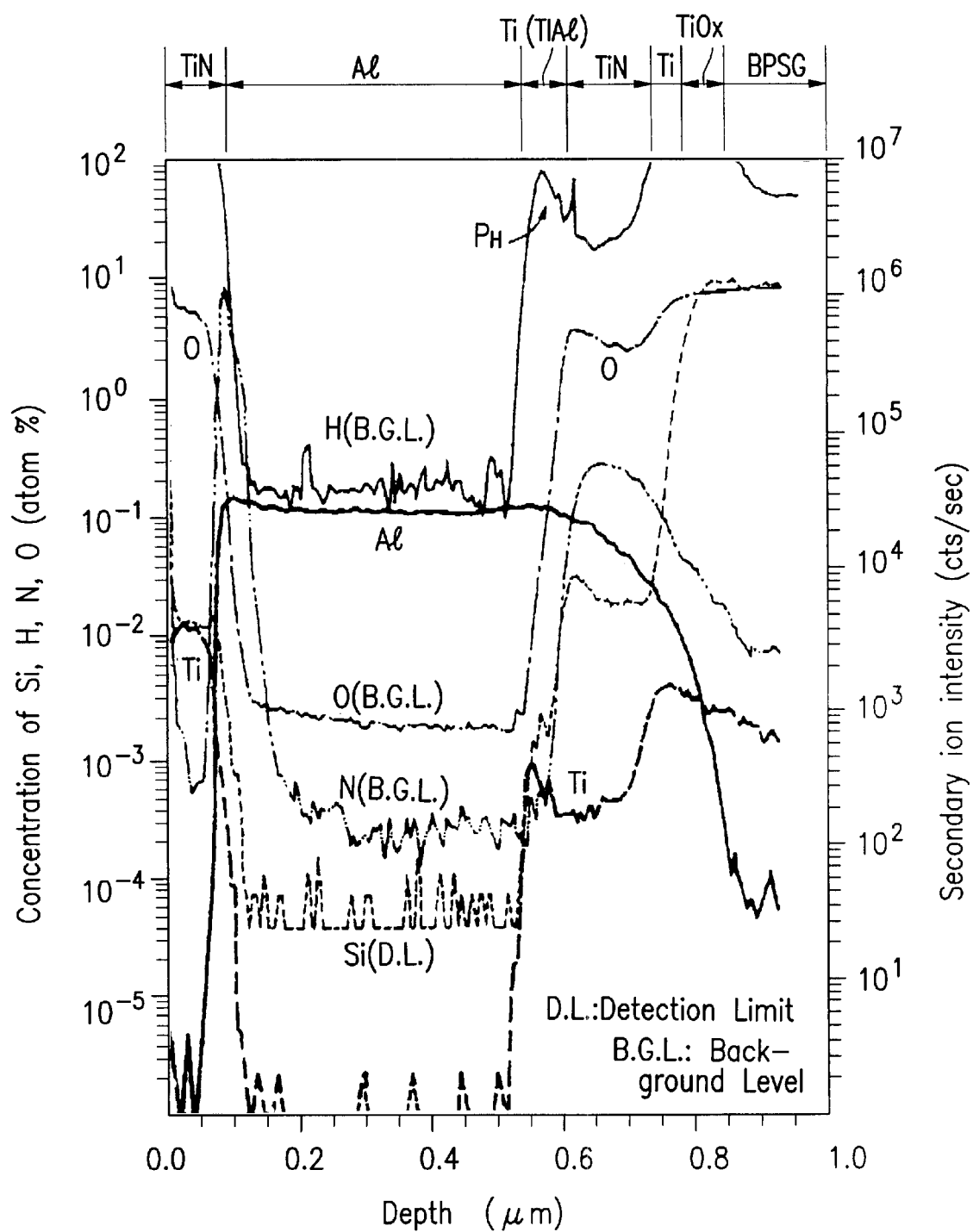
FIG. 7 shows data obtained by a SIMS for a laminated structure which has a wetting layer.

FIG. 6 and FIG. 7 show results of measurements by Secondary Ion Mass Spectroscopy (SIMS), using irradiation of cesium primary ions. FIG. 6 shows data for a laminated structure having a film structure (including TiN film/Al film/TiN film/Ti film) which does not have a wetting layer between barrier layer 33 and the first film. FIG. 7 shows data for a laminated structure having a film structure (including TiN film/Al film/Ti film/TiN film/Ti film) which has a wetting layer of titanium between barrier layer 33 and the first film. An axis of ordinates on the left-hand side quantitatively indicates amounts of hydrogen, nitrogen and oxygen in the film, and an axis of ordinates on the right-hand side indicates intensities of secondary ions of layers other than the Al film.

The experiment sample shown in FIG. 6 is formed by the above-described method except that the degasification process in the step (C) is not performed. The experiment sample shown in FIG. 7 is different from the experiment sample shown in FIG. 6 in that the experiment sample shown in FIG. 7 has a Ti film under the Al film. It is confirmed based on FIGS. 6 and 7 that the Al film contains only background levels of hydrogen, oxygen and nitrogen, that are lower than the minimum concentration levels detectable by the SIMS, and rarely contain hydrogen, oxygen and nitrogen in solid solution.

Figure 9:
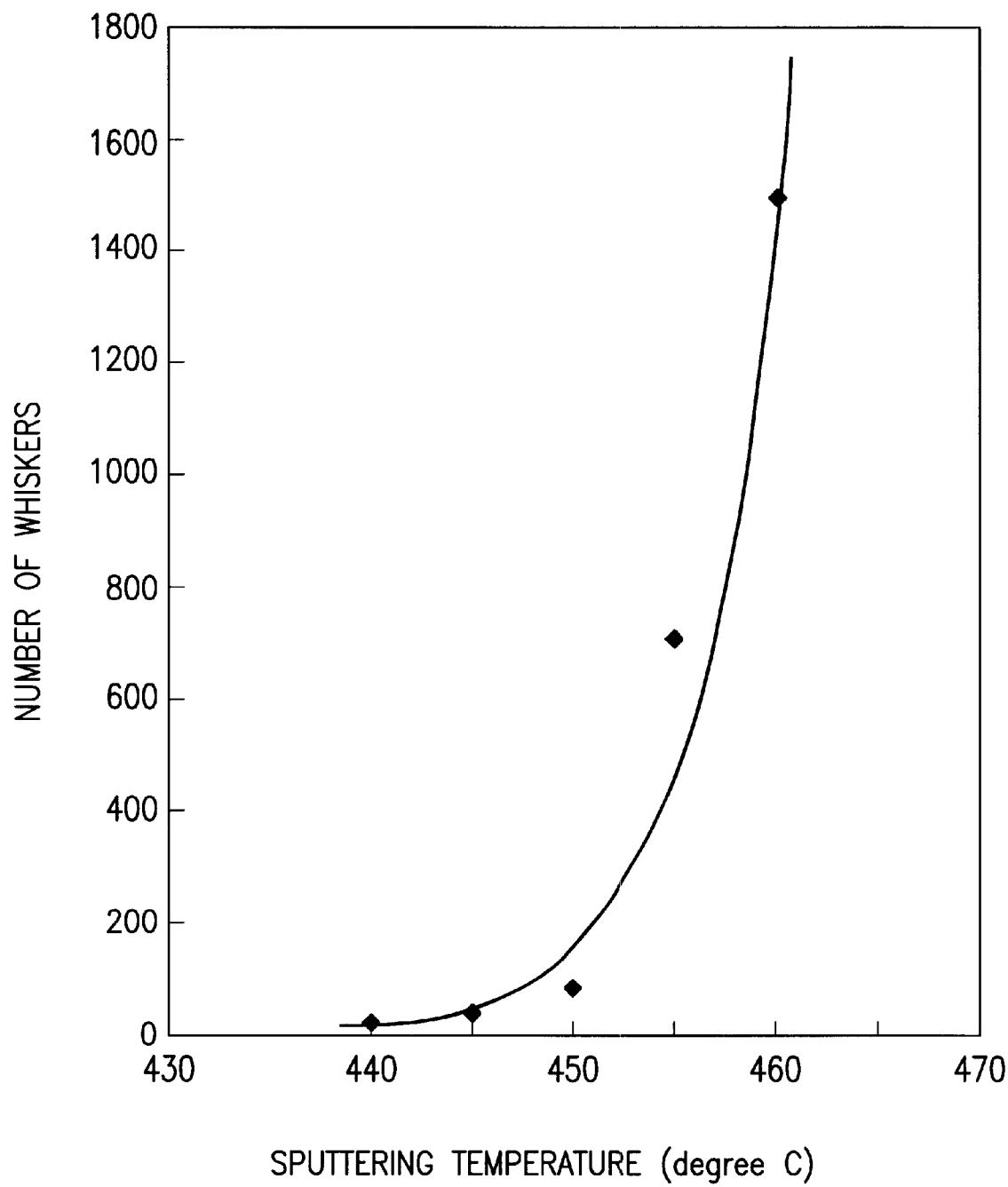
FIG. 9 shows relations between sputtering temperatures and occurrence of whiskers when the second conductive film is formed.

Also, it is observed that when the wetting layer (Ti layer) is present, a large peak of hydrogen (H) concentration indicated by reference PH occurs as shown in FIG. 7. This is an indication that the wetting layer contains a large amount of hydrogen. Relations between the sputtering temperature and occurrence of whiskers at the time of film formation of the second aluminum film are investigated. FIG. 9 shows the relations. The first coating film is formed to a film thickness of 200 nm with application of power of 9 kW to the sputter apparatus, and the second film is formed to a film thickness of 550 nm with a power of 1 kW being applied to the sputter apparatus.

As shown in FIG. 9, occurrence of whiskers sharply increases when the sputtering temperature exceeds over 450° C. Accordingly, it is understood that when the second coating film is formed with the sputtering temperature being lower than 450° C., occurrence of whiskers can be restricted. In accordance with one or more embodiments of the invention, a degasification treatment is performed for the interlayer dielectric film after the contact hole is formed and the wafer is sufficiently cooled before the film is formed. As a result, barrier layer 33 and the first film have sufficient coherency. Gases such as hydrogen, nitrogen and oxygen—that are contained in layers under the first film 34—are sufficiently removed by the degasification treatment. Also, because the gases cannot pass through the first film, the surface of the first film is very clean. Therefore, when the second film is formed, coating material smoothly moves and flows along the surface of the first film and forms a good embedded layer.

In one or more embodiments of the invention, first 34 and second film 35 are embedded well in the contact hole due to the following reasons. By performing the degasification process, water and nitrogen contained in the interlayer dielectric film, and particularly in the BPSG film, are gasified and sufficiently discharged. As a result, generation of gases from BPSG film 30 and barrier layer 33 is prevented when first film 34 and second film 35 are later formed. Consequently, barrier layer 33 and first film 34 can be formed with high coherency and therefore good step coverage.

The substrate temperature is set at a relatively low temperature (e.g., at 200° C. or lower) when first film 34 is formed. As a result, water and nitrogen contained in BPSG film 30 and barrier layer 33 are prevented from being discharged, with the result that the coherency of first film 34 is further increased in addition to the effect provided by the degasification process. Further, first film 34 itself plays a role to restrict generation of gasses from layers provided below first film 34 when the substrate temperature rises. As a result, second film 35 can be formed at a relatively high temperature, and therefore flow and diffusion can be optimally conducted for the second film.

In another embodiment of the invention, a degasification process and a cooling process are conducted before sputtering for coating films (first film 34 and second film 35), and coating films are continuously formed in the same chamber. As a result, small contact holes (e.g., having a diameter of about 0.21 μm or less) can be filled only with the coating film material such as aluminum or an aluminum alloy, and therefore the device reliability and production yield are improved. Further, the aluminum films forming the contact section do not have partial precipitation of copper or abnormal growth of crystal grains, and are highly reliable in various aspects including migration and the like.

In one or more embodiments of the invention, before the coating material for second film 35 is solidified, the substrate is transferred to a different chamber and the substrate is gradually cooled. By this process, thermal stresses generated in second film 35 are alleviated, and generation of whiskers in the surface of second film 35 is restricted. This invention has been described, in part, as applicable to a semiconductor device including an N-channel type MOS element. However, the present invention as described has broad application to other types of semiconductor devices (e.g., a P-channel type or CMOS type element) as well. Also, in the embodiments described above, references are made to coating aluminum films used for forming conductive layers over an interlayer dielectric film. However, aluminum is used only by way of example, and the invention is equally applicable to single and multilevel coating layers formed from any type of conductive material.

Thus, a method and apparatus for manufacturing semiconductor devices is described in conjunction with one or more specific embodiments. The invention is defined by the claims and their full scope of equivalents.

We claim:

1. A method for manufacturing a semiconductor device, comprising:

forming an opening in an interlayer dielectric films formed on a semiconductor substrate;

forming a conductive coating made of a material containing aluminum over the interlayer dielectric film and covering said opening, the conductive coating including one or more conductive films formed successively at respective film formation temperatures; and cooling the formed conductive coating from the film formation temperature at which a last one of the successively formed conductive films is formed, without heating the conductive coating after the step of forming the conductive coating, the cooling being sufficiently slow to alleviate thermal stress generated in the formed conducive coating, wherein the step of forming the conductive coating and the step of cooling the conductive coating are continuously performed in an apparatus having a plurality of chambers that are maintained under a reduced pressure state.

2. The method of claim 1, wherein said opening is formed through the interlayer dielectric film.

3. The method of claim 1, wherein the step of forming said conductive coating comprises:

forming a first conductive film on said interlayer dielectric film at a first film formation temperature; and forming a second conductive film on said first conductive film at a second film formation temperature different than the first film formation temperature.

4. The method of claim 3, wherein said second film formation temperature is higher in degree than the first film formation temperature.

5. The method of claim 3, wherein said first film formation temperature is 200° C. or lower.

6. The method of claim 5, wherein said second film formation temperature is 300° C. or higher.

7. The method of claim 3, wherein the thicknesses of the first and second conductive films are about 150–300 nm and 300–600 nm, respectively.

8. The method of claim 1 further comprising removing gasification components contained in said interlayer dielectric film after forming the opening in said interlayer dielectric film.

9. The method of claim 8, wherein said removal of gasification components comprises performance of heat treatment under reduced pressure at substrate temperatures.

10. The method of claim 9, wherein said substrate temperatures are between 300 and 550° C.

11. The method of claim 1, further comprising cooling the substrate to a third temperature prior to forming the conductive coating on the interlayer dielectric film.

12. The method of claim 11, wherein said third temperature is 100° C. or lower.

13. The method of claim 1, wherein the opening has a lateral dimension of about 0.2–0.8 μm and an aspect ratio of about 0.5–3.

14. A method for manufacturing a semiconductor device, comprising:

forming an opening in an interlayer dielectric film formed on a semiconductor substrate;

performing beat treatment under reduced pressure and at substrate temperature to remove gasification components contained in the interlayer dielectric film;

forming a conductive coating made of a material containing aluminum on surfaces of the interlayer dielectric film including the opening, wherein the step of forming the conductive coating comprises:

forming a first conductive film over said interlayer dielectric film by a sputtering method at a first film formation temperature; and forming a second conductive film over said first conductive film by a sputtering method at a second film formation temperature higher than said first film formation temperature; and cooling the formed conductive coating from the second film formation temperature without heating the conductive coating after the step of forming the conductive coating, the cooling being sufficiently slow to alleviate thermal stress generated in the formed conductive coating, wherein the step of forming the a conductive coating and the step of cooling the conductive coating are continuously performed in an apparatus having a plurality of chambers that are maintained under a reduced pressure state.

15. The method of claim 14, wherein said first and second conductive films are continuously formed in a same apparatus.

16. The method of claim 15 further comprising, forming a third conductive film over said first and second conductive films at a fourth film formation temperature, after gradually cooling said first and second conductive films.

17. The method of claim 16, wherein said fourth film formation temperature is lower than said first film formation temperature.

18. The method of claim 17, wherein said fourth film formation temperature is approximately 100° C.

19. The method of claim 18, wherein said third conductive film is formed by a sputtering method over said first and second conductive films.

20. The method of claim 19, wherein said step of cooling said conductive coating and said step of forming said third conductive film on said conductive coating are continuously performed in a same apparatus.

21. The method of claim 14, wherein the opening has a lateral dimension of about 0.2–0.8 μm and an aspect ratio of about 0.5–3.

22. The method of claim 19, wherein the thicknesses of the first and second conductive films are about 150–300 nm and 300–600 nm, respectively.

* * * * *